United States Patent
Rubin Ben Haim et al.

(10) Patent No.: US 10,591,822 B2
(45) Date of Patent: Mar. 17, 2020

(54) IMAGING DEVICE

(71) Applicant: Landa Labs (2012) Ltd., Rehovot (IL)

(72) Inventors: Nir Rubin Ben Haim, Hod HaSharon (IL); Michael Nagler, Tel Aviv (IL); Benzion Landa, Nes Ziona (IL); Tamar Kashti, Nes Ziona (IL); Ofer Aknin, Petach Tikva (IL); Ronen Yogev, Kibbutz Hulda (IL); Itai Tzur, Kibbutz Na'an (IL)

(73) Assignee: LANDA LABS (2012) LTD., Rehovot (IL)

( * ) Notice: Subject to any disclaimer, the term of this patent is extended or adjusted under 35 U.S.C. 154(b) by 0 days.

(21) Appl. No.: 16/046,973

(22) Filed: Jul. 26, 2018

(65) Prior Publication Data
US 2018/0329306 A1   Nov. 15, 2018

Related U.S. Application Data

(60) Division of application No. 15/363,129, filed on Nov. 29, 2016, now Pat. No. 10,061,200, which is a (Continued)

(30) Foreign Application Priority Data

May 27, 2015   (GB) .................................. 1509073.1
May 27, 2015   (GB) .................................. 1509077.2

(51) Int. Cl.
*G03F 7/20*   (2006.01)
*B41J 2/447*   (2006.01)
(Continued)

(52) U.S. Cl.
CPC .......... *G03F 7/70025* (2013.01); *B41J 2/447* (2013.01); *B41J 2/45* (2013.01); *B41J 2/451* (2013.01);
(Continued)

(58) Field of Classification Search
None
See application file for complete search history.

(56) References Cited

U.S. PATENT DOCUMENTS

| 4,435,064 A | 3/1984 | Tsukada et al. |
| 5,568,320 A | 10/1996 | Rees et al. |
| (Continued) | | |

FOREIGN PATENT DOCUMENTS

| CN | 101337469 | 1/2009 |
| DE | 19707157 | 8/1998 |
| (Continued) | | |

OTHER PUBLICATIONS

Machine translation of JPS5726874.
(Continued)

*Primary Examiner* — Alejandro Valencia
(74) *Attorney, Agent, or Firm* — Shalom Wertsberger; Saltamar Innovations (57) ABSTRACT

An imaging device for projecting individually controllable laser beams onto an imaging surface movable in an X-direction. The device includes a plurality of semiconductor chips each comprising a plurality of laser beam emitting elements arranged in a main array of M·N. The chips are mounted such that each pair of adjacent chips in the Y-direction are offset from one another in the X-direction and, if activated continuously, the emitted laser beams of the two chips of said pair trace on the imaging surface a set of parallel lines that are substantially uniformly spaced in the Y-direction. In addition to the M·N elements of the main array, each chip comprises at least one additional column on one or each side, each additional column containing at least one selectively operable element capable of compensating for any misalignment in the Y-direction in the relative positioning of the adjacent chips on the support.

15 Claims, 5 Drawing Sheets

Related U.S. Application Data continuation-in-part of application No. PCT/IB2016/053137, filed on May 27, 2016, and a continuation-in-part of application No. PCT/IB2016/053138, filed on May 27, 2016.

(51) Int. Cl.

| | | |
|---|---|---|
| *B41J 2/45* | (2006.01) | |
| *B41J 2/455* | (2006.01) | |
| *G03G 15/04* | (2006.01) | |
| *G03G 15/043* | (2006.01) | |
| *G03G 15/34* | (2006.01) | |

(52) U.S. Cl.
CPC ............ *B41J 2/455* (2013.01); *G03G 15/043* (2013.01); *G03G 15/04072* (2013.01); *G03G 15/342* (2013.01)

(56) References Cited

U.S. PATENT DOCUMENTS

| | | | |
|---|---|---|---|
| 5,751,327 A | 5/1998 | De Cock et al. | |
| 5,973,709 A * | 10/1999 | Tanuma | G06K 15/1247 347/131 |
| 6,469,728 B1 | 10/2002 | Charnitski et al. | |
| 6,623,816 B1 | 9/2003 | Tanikawa et al. | |
| 6,768,507 B2 | 7/2004 | Gardner | |
| 7,002,613 B2 | 2/2006 | Beier et al. | |
| 10,061,200 B2 * | 8/2018 | Rubin Ben Haim | G03F 7/70025 |
| 2002/0031645 A1 | 3/2002 | Sano et al. | |
| 2006/0109440 A1 | 5/2006 | De Jager | |
| 2008/0166495 A1 | 7/2008 | Maeno et al. | |
| 2008/0181667 A1 | 7/2008 | Nomura et al. | |
| 2009/0009580 A1 | 1/2009 | Nomura | |
| 2009/0140631 A1 | 6/2009 | Jo | |
| 2009/0141114 A1 | 6/2009 | Tsujino et al. | |
| 2010/0080594 A1 | 4/2010 | Sowa et al. | |
| 2013/0235116 A1 | 9/2013 | Takemoto | |
| 2014/0063161 A1 | 3/2014 | Liu | |
| 2014/0168330 A1 | 6/2014 | Liu et al. | |
| 2017/0072427 A1 | 3/2017 | Landa et al. | |
| 2017/0072428 A1 | 3/2017 | Landa et al. | |
| 2017/0075226 A1 | 3/2017 | Nagler et al. | |
| 2017/0080700 A1 | 3/2017 | Landa et al. | |

FOREIGN PATENT DOCUMENTS

| | | |
|---|---|---|
| EP | 1280612 | 2/2003 |
| EP | 2036734 | 3/2009 |
| EP | 2481597 | 8/2012 |
| GB | 0830836 | 3/1960 |
| GB | 2034608 | 6/1980 |
| JP | S5557801 A | 4/1980 |
| JP | S5726874 A | 2/1982 |
| JP | S60-245589 | 12/1985 |
| JP | S6168253 | 4/1986 |
| JP | S6299166 A | 5/1987 |
| JP | H11188921 | 7/1999 |
| JP | 2002254696 | 9/2002 |
| JP | 2004-090330 | 3/2004 |
| JP | 2006-263537 | 5/2006 |
| JP | 2006186192 A | 7/2006 |
| JP | 2008074052 A | 4/2008 |
| JP | 2008194897 | 8/2008 |
| JP | 2009056795 A | 3/2009 |
| JP | 2009149051 A | 7/2009 |
| JP | 2009158477 A | 7/2009 |
| RU | 2169977 | 6/2001 |
| WO | WO 2013191535 | 12/2013 |

OTHER PUBLICATIONS

Machine Translation of JP2009056795A.
Machine Translation of JPS5557801A.
Machine Translation of JP2009149051.
Machine Translation of JP2008074052A.
Machine Translation of JP2006186192.
Machine Translation of JPS6299166A.
Machine Translation of JP2009158477A.

* cited by examiner

IMAGING DEVICE

RELATED APPLICATIONS

This Patent Application incorporates by reference in their entirety International Patent Applications Nos. PCT/IB2016/053138 and PCT/IB2016/053137, filed on May 27, 2016, and GB Patent Applications Nos. 1509073.1 and 1509077.2, filed on May 27, 2015.

FIELD

The present disclosure relates to an imaging device for projecting a plurality of individually controllable laser beams onto a surface that is movable relative to the imaging device.

BACKGROUND

U.S. Pat. No. 7,002,613 describes a digital printing system to which the imaging device of the present disclosure is applicable, by way of example. In particular, in FIG. 8 of the latter patent specification, there is shown an imaging device designated 84 that is believed to represent the closest prior art to the present disclosure. The imaging device serves to project a plurality of individually controllable laser beams onto a surface, herein termed an imaging surface, to generate an energy image onto that surface. The laser image can be used for a variety of purposes, just a few examples being to produce a two dimensional printed image on a substrate, as taught for instance in U.S. Pat. No. 7,002,613, in 3D printing and in etching of an image onto any surface.

For high throughput applications, such as commercial printing or 3D lithography, the number of pixels to be imaged every second is very high, demanding parallelism in the imaging device. The laser imaging device of the present disclosure is intended for applications that require energy beams of high power where the total power required can be of tens or hundreds of milliwatt (mW). For instance, in the field of printing, depending on the desired printing speed, the energy beams can provide powers of up to 10 mW, 100 mW and even 250 mW or higher. One cannot therefore merely scan the imaging surface with a single laser beam, so as to expose the pixels sequentially. Instead, the imaging device is required to have a plurality of laser emitting elements for various pixels (picture elements) each laser capable of tracing a line of pixels in the image area of an imaging surface in relative motion.

To achieve acceptable print quality, it is important to have as high a pixel density as possible. A high resolution image, for example one having 1200 dpi (dots per inch), requires a density of laser emitting elements that is not achievable if the laser emitting elements all lie in a straight line, due to the amount of overlap necessary between the laser sources to achieve a uniform printing quality. Aside from the fact that it is not physically possible to achieve such a high packing density, adjacent elements would interfere thermally with one another.

Semiconductor chips are known that emit beams of laser light in an array of M rows and N columns. In U.S. Pat. No. 7,002,613 the rows and columns are exactly perpendicular to each other but the chips are mounted askew, in the manner shown in FIG. 1 of the latter patent, so that each row can fill in the missing pixels of the preceding row(s). In this way, such an array can achieve a high resolution image but only over the width of the chip and such chips cannot simply be mounted side by side if one is to achieve a printed image without stripes along its length, because the chips cannot have laser emitting elements positioned sufficiently close to their lateral edges.

U.S. Pat. No. 7,002,613 avoids this problem by arranging such chips in two rows, in the manner shown in FIG. 8 of the latter patent. The chips in each row are staggered relative to the chips in the other row of the pair so that each chip in one row scans the gap left unscanned by the two adjacent chips in the other row.

Even though it is expected that the rows of chips will be mounted on a support under clean laboratory conditions using a microscope to achieve their correct alignment, it is guaranteeing that the relative alignment of the chips in the two rows will be accurate within the resolution of the printed image is difficult and expensive. Any misalignment will result in the image having stripes or other undesired defects.

US 2010/080594 and US 2008/181667 describe systems in which the light from arrays of LED's (rather than laser sources) is projected onto an image surface and teach how steps may be taken to compensate for any misalignment between the arrays. In each case, the images produced by adjacent arrays are overlapped and selected LED's from one or other of the two arrays are activated to maintain image continuity at the boundary between the two arrays. In the case of US 2010/080594 this overlap is shown clearly in FIG. 14 and in US 2009/181667 it is evident, for example, from FIGS. 9A and 9B.

SUMMARY

In the present disclosure, there is disclosed an imaging device for projecting individually controllable laser beams onto an imaging surface that is movable relative thereto in a reference X-direction, the device including a plurality of semiconductor chips each of which comprises a plurality of individually controllable laser beam emitting elements arranged in a two dimensional main array of M rows and N columns (M·N), the elements in each row having a uniform spacing $A_r$ and the elements in each column having a uniform spacing $a_c$, wherein the chips are mounted on a support in such a manner that when nominally placed, each pair of chips that are adjacent one another in a reference Y-direction, transverse to the X-direction, are offset from one another in the X-direction, and such that the center of laser beam emitting elements of the main M·N emitting elements arrays of both chips in the pair are nominally uniformly spaced in the Y-direction by a nominal distance $A_r/M$, without overlap in the Y-direction between the beam emitting elements of the adjacent chips. Stated differently, were all the laser emitting elements of the pair of nominally placed adjacent chips to be activated continuously, and were the chips and imaging surface to be in relative motion in the X-direction, the emitted laser beams of the respective main arrays of the two chips of the pair would trace on the imaging surface a set of parallel lines that extend in the X-direction and that are nominally uniformly spaced in the Y-direction. The lines traceable by emitting elements of the first chip would not interlace with the lines traceable by emitting elements of the second chip.

As a major object of the invention involves compensating for minor misalignment of the chips, it is important to realize that the disclosure of relative placement relates to the desired positioning within certain tolerances that enables satisfactory results from the imaging device. Therefore, the term "nominally", should be construed to mean that the stated spatial relationship exist when the chips or other relevant elements are disposed at their intended placing.

However, different aspects of the invention allow compensating for chip placements that diverge from that nominal position. Similarly, when used to indicate spatial relationship the term "beam" should be considered as relating primarily to the center of the beam, unless otherwise indicated or clear from the context. Thus by way of example the uniform spacing $A_r$ and $a_c$ relate to the distance between the centers of the laser beam emitting elements.

In order to compensate for minor misalignment, in addition to the M rows and N columns of elements of the main array, each chip comprises at least one additional column on at least one side of the main array, each such additional column containing at least one selectively operable laser emitting element disposed for tracing at least one additional line that lies between the two sets of M·N lines. This element, also termed the additional element or the alignment element, is thus capable of compensating for some misalignment in the Y-direction in the relative positioning of the adjacent chips on the support.

Assuming that the M rows and N columns of laser emitting elements of the main array do not include any elements that are normally redundant, the spacing between adjacent lines in the set will be equal to $A_r/M$, namely the spacing of the adjacent elements in each row divided by the number of rows. Furthermore, because in the present disclosure there is no overlap between the two sets of M·N lines traced by any two adjacent chips, the total number of lines traced by the two chips will be equal to 2·M·N, namely twice the product of the number of rows and the number of columns in each chip, if the chips have equal numbers of rows and columns.

In an aspect of the invention, in addition to these evenly spaced lines produced by the main M·N arrays, additional laser emitting elements are provided on at least one end, or on both ends of each array, intended only to compensate for chip misalignment. If adjacent chips are correctly aligned, the elements of the additional columns will be redundant and will not be energized. However, if a gap should remain between the lines traced by adjacent chips, the additional elements can introduce additional lines to fill that gap at a position approximating the uniform spacing of the lines traced by the main M·N arrays. It should be noted that, in contrast to the proposals in US 2010/080594 and US 2008/181667, the lines traced by the additional elements do not fall between (i.e. are not interlaced with) the lines of either set of M·N lines traced by the main arrays and only fall within any gap between the two sets of M·N lines.

Were the imaging surface moved relative to laser beams emitted by adjacent laser elements, the laser radiation centered on each line traced in the X-direction, would have a non-uniform energy profile which typically, but not necessarily, approaches a Gaussian intensity distribution. The spot size traced can be made large enough so that the energy traced by one laser element overlaps the area traced by an adjacent element and the intensity combination of the two beams, as well as the control over the amplitude of one or both beams, offers a combined intensity profile whose maximum may be moved between the two adjacent traced lines by controlling the relative intensity, and/or timing, thus placing an intermediate line traced at a selectable position between the two original line centers.

In the event of an overlap between the two sets of M·N lines traced by the elements of adjacent chips, some of the elements of the main arrays can be switched off and if necessary replaced by an element of the additional columns to maintain the appearance of a raster with uniformly spaced lines.

On the other hand, if a gap exists between the two M·N lines traced by the elements of adjacent chips, the additional columns can be activated to maintain the appearance of a raster with uniformly spaced lines.

One of the additional elements may be activated on its own if its position coincides with a line that would render the raster uniform. Alternatively, if the elements have a symmetrical energy profile, resembling for example a Gaussian or a sinusoidal distribution, it is possible, by activating two elements to irradiate adjacent spots on the imaging surface and separately adjusting the power of each element, to produce a single raster line at an adjustable distance from the raster lines of the main elements of the two chips. It should be noted that this effect is thermally dynamic and additive provided that the adjacent spots are irradiated within a finite time of each other. In other words, the imaging surface should not have time to dissipate the energy of the first laser pulse in the interval between the two laser pulses. Furthermore, the two elements may be either on a single additional column of one chip or on additional columns each residing on a separate chip, assuming that the additional columns are disposed between the respective main arrays of the two chips. Chips having additional columns on both sides of the main arrays would provide such arrangement of the additional columns of the two chips being disposed between the respective chips main arrays.

Conveniently, the lines traced by elements in the additional column are evenly spaced from one another, the spacing between the lines traced by the element of the additional column being substantially equal to the quotient of the spacing of the lines traced by the elements of main array and the number of elements in the additional column.

While it would be possible to use chips in which the rows and columns of the main arrays of laser emitting elements are perpendicular to one another, as taught in U.S. Pat. No. 7,002,613, doing so requires the chips to be placed at an angle relative to the Y-direction. In some embodiments of the present disclosure the elements in each row of each chip lie on a line parallel to the Y-direction and the elements in each column of each chip lie on a straight line inclined at an angle to the X-direction. In other words, instead of the outline of the array being square, the array is shaped as a parallelogram. This arrangement, which may be considered slightly wasteful as far as chip area is concerned, can be advantageous in terms of assembling procedure.

It is convenient for the chips to be arranged in at least one pair of rows on the support, with corresponding laser emitting elements of all the chips in each of the two rows lying in line with one another in the Y-direction. By "corresponding elements" it is meant that the individual laser emitting elements of the M·N main array should occupy the same row and column positions within their respective chips. It is advantageous for corresponding elements in any group of three chips in the pair of rows that are adjacent one another in the X and Y-directions to lie at the apices of congruent equilateral triangles. This arrangement simplifies the construction of the lens system to focus the laser beams onto the imaging surface.

It has been found particularly advantageous for all the laser beams emitted by one chip to be focused on the imaging surface by a common single lens, or a common set of lenses arranged in series, having a magnification $M_o$ whose absolute value is greater than or equal to one (1), however magnification lower than one (1) is also explicitly considered. It was found to be even more advantageous if the magnification $M_o$ was substantially equal to +1, as that would ensure that the laser elements can be spaced adequately on the chip even for high resolution systems. Stated differently, the image of the array of laser elements on the imaging surface (i.e. an array of dots) would have the same size as the array on the chip, though it may be inverted with a magnification of −1. Notably, even if a slight misalignment of the lenses exists, such as GRIN rod (Gradient-Index) lenses, in the XY plane perpendicular to the optical axis of the lens, the position of the illuminated laser spot on the imaging surface will remain unchanged, as it only depends on the position of the laser emitting element on the laser array chip. The former elements can be positioned with very high accuracy on every laser array chip using standard semiconductor manufacturing techniques.

While the lens system may comprise a single GRIN rod associated with each chip, it may alternatively comprise a plurality of GRIN rods arranged in series with one another and forming a folded light path where the fold is in the space where a beam emitted by the laser elements is substantially individually collimated. In folded light path embodiments, a reflecting member such as a prism or mirror which is optionally common to all the chips may serve to direct the laser beams from one GRIN rod element to the next in each series. In such a folded light path configuration, it is desirable for the reflecting member to be on a facet of a folding prism made of a material, typically a glass, having a higher refractive index than the highest refractive index in the GRIN rods. The higher index of refraction of the prism will limit the angular divergence of the collimated beams and allow larger separation between the sequential GRIN rod segments. A suitable light path folding prism can be for example a right angle prism, the folding face of the prism being a reflecting surface. Other types of reflecting members and folding angles can be used depending on the geometry of the system and the direction to be given to beams in the series.

It is convenient for the main array of each chip to have an equal number of rows and columns of laser beam emitting elements (i.e., M=N), as this minimizes the size of the lens system.

Within each chip, the separation between the laser elements is desirably sufficiently great to minimize thermal interference between adjacent laser emitting elements.

The support for the chip arrays may be fluid cooled to help dissipate the heat that may be generated by the chips.

In certain embodiments, the support may be a rigid metallic or ceramic structure and it may be formed of, or coated with, an electrically insulating surface bearing film conductors to supply electrical signals and power to the chips.

The chips in some embodiments are vertical cavity surface emitting laser (VCSEL) chip arrays. Equivalently other types of laser sources may be utilized and the term VCSEL should be construed as encompassing such laser sources.

In some embodiments, the intensity of the laser beam emitted by each element may be adjustable either continuously (in an analogue manner) or in discrete steps (digitally). In one embodiment, the chips may include D/A converters so as to receive digital control signals. In this way, the laser beam intensity may be controllably adjusted in a plurality of discrete steps, such as 2, 4, 8, 16, 32, . . . 4096 and the like.

In a further aspect of the present disclosure, there is provided a method of projecting individually controllable laser beams onto an imaging surface that is movable relative to an imaging device utilizing the imaging device of any embodiment of the present disclosure, so as to form an image comprising pixels or lines thereof when the projected laser beam is intermittent or continuous, respectively.

In some embodiments, at least one pair of laser elements, selected either both from the same array or one from each of two adjacent arrays, are controlled in such a manner that their energies are combined on the imaging surface to increase the temperature of the imaging surface above a predetermined threshold at a point intermediate the centers of the images of the two laser elements on the imaging surface, without raising the temperature of the imaging surface at at least one of the centers of the images of the two laser elements above the latter threshold.

Clearly in operation the laser emitting elements are switched on and off as needed to provide the required image on the imaging surface, as continuous operation of all laser beams would result in a substantially uniformly irradiated surface.

BRIEF DESCRIPTION OF THE DRAWINGS

Some embodiments of the imaging device are described herein with reference to the accompanying drawings. The description, together with the figures, makes apparent to a person having ordinary skill in the art how the teachings of the disclosure may be practiced, by way of non-limiting examples. The figures are for the purpose of illustrative discussion and no attempt is made to show structural details of an embodiment in more detail than is necessary for a fundamental and enabling understanding of the disclosure. For the sake of clarity and simplicity, some objects depicted in the figures are not to scale.

In the Figures.

DETAILED DESCRIPTION

The imaging device will be described herein mainly by reference to its application in digital printing systems however its use is not limited to this application, and different aspects of the invention may be implemented to controllably project image forming light beams onto any surface with relative motion between the surface and the chips.

Overall Description of an Exemplary Printing System

Figure 1:
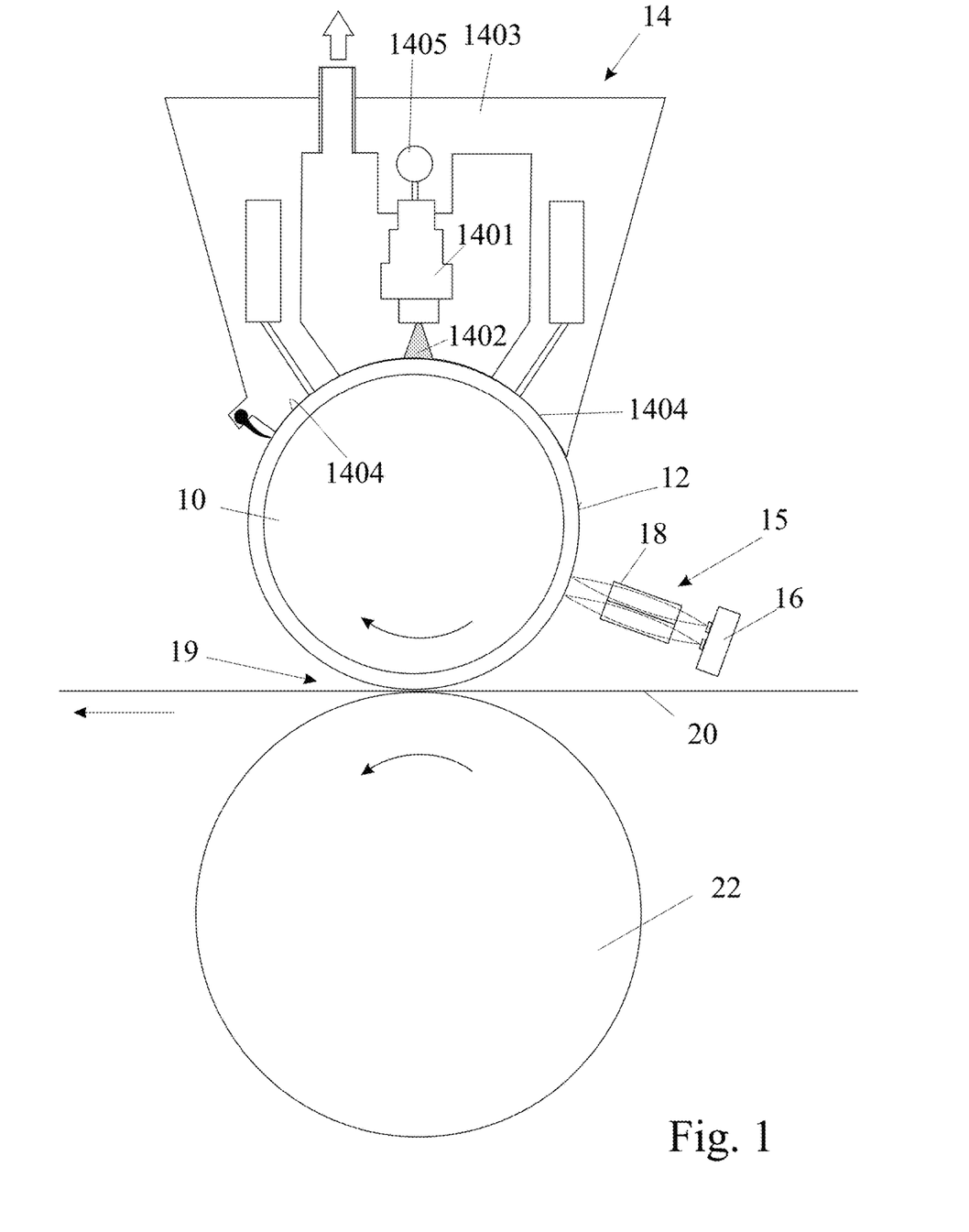
FIG. 1 is a schematic diagram of a digital printing system utilizing an imaging device according to an embodiment of the present disclosure.

FIG. 1 shows a drum 10 having an outer surface 12 that serves as an imaging surface. As the drum rotates clockwise, as represented by an arrow, it passes beneath a coating station 14 where it acquires a monolayer coating of fine particles. After exiting the coating station 14, the imaging surface 12 passes beneath an imaging device 15 of the present disclosure where selected regions of the imaging surface 12 are exposed to laser radiation which renders the particle coating on the selected regions of the surface 12 tacky. Next, the imaging surface passes through an impression station 19 where a substrate 20 is compressed between the drum 10 and an impression cylinder 22. The pressure applied at the impression station causes the selected regions of the coating on the imaging surface 12 that have been rendered tacky by exposure to laser radiation by the imaging device 15 in the correspondingly termed imaging station to transfer from the imaging surface 12 to the substrate 20.

The term "tacky" as used herein is intended to mean that the irradiated particle coating is not necessarily tacky to the touch but only that it is softened sufficiently to be able to adhere to the surface of a substrate when pressed against it in the impression station 19.

The regions on the imaging surface 12 corresponding to the selected tacky areas transferred to the substrate 20 consequently become exposed, being depleted by the transfer of particles. The imaging surface 12 can then complete its cycle by returning to the coating station 14 where a fresh monolayer particle coating is applied only to the exposed regions from which the previously applied particles were transferred to the substrate 20 in the impression station 19.

Advantageously, a monolayer of particles facilitates the targeted delivery of radiation as emitted by the laser elements of an imaging device according to present teachings. This may ease the control of the imaging device and process, as the selectively irradiated particles reside on a single defined layer. When considered for use in a printing system, an imaging device targeting a monolayer can preferably focus the laser radiation to form upon transfer to a substrate a dot of approximately even thickness and/or relatively defined contour.

Reverting to the coating station 14, it may comprise a plurality of spray heads 1401 that are aligned with each other along the axis of the drum 10 and only one is therefore seen in the section of FIG. 1. The sprays 1402 of the spray heads are confined within a bell housing 1403, of which the lower rim 1404 is shaped to conform closely to the imaging surface leaving only a narrow gap between the bell housing 1403 and the drum 10. The spray heads 1401 are connected to a common supply rail 1405 which supplies to the spray heads 1401 a pressurized fluid carrier (gaseous or liquid) having suspended within it the fine particles to be used in coating the imaging surface 12.

The imaging device 15 in FIG. 1 is composed of a support 16 carrying an array of chips each having an arrangement of individually controlled laser sources capable of emitting laser beams. In some embodiments, the laser beam emitting elements can coherently emit light in a range of wavelengths from about 400 nm to about 12 µm, or up to about 10 µm, or up to about 8 µm, or up to about 3 µm, or up to about 1.4 µm. Such ranges includes regions generally known as Near Infra Red (NIR, ~0.75-1.4 µm), Short-Wavelength Infra Red (SWIR, ~1.4-3 µm), Mid-Wavelength Infra Red (MWIR), also called Intermediate Infra Red (IIR, 3-8 µm), and Long-Wavelength Infra Red (LWIR, 8-15 µm), also known as Thermal Infra Red (TIR). In a particular embodiment, the laser beam emitting elements are NIR lasers. The laser sources may by way of example, be of VCSEL (Vertical Cavity Surface Emitting Laser) type, however other types may be utilized. By way of example, semiconductor lasers commercially available as laser diodes are capable of emitting at wavelengths from 375 nm to 3,500 nm, covering most of NIR and SWIR regions of the spectrum. Gas lasers can emit over various area of the spectrum, depending on the elected gas and some optical design. Commercial carbon dioxide ($CO_2$) lasers, for instance, can emit hundreds of watts in the thermal infrared region at 10.6 µm. While for brevity the term VCSEL is predominantly used herein, it should be construed as encompassing any such laser sources which may be better suited for certain embodiments.

Each chip has individually controllable laser beam emitting elements arranged in a two dimensional main array of M rows and N columns (M·N), the elements in each row having a uniform spacing $A_r$ and the elements in each column having a uniform spacing $a_c$. As disclosed below, at least one additional column is also provided.

Figure 2:
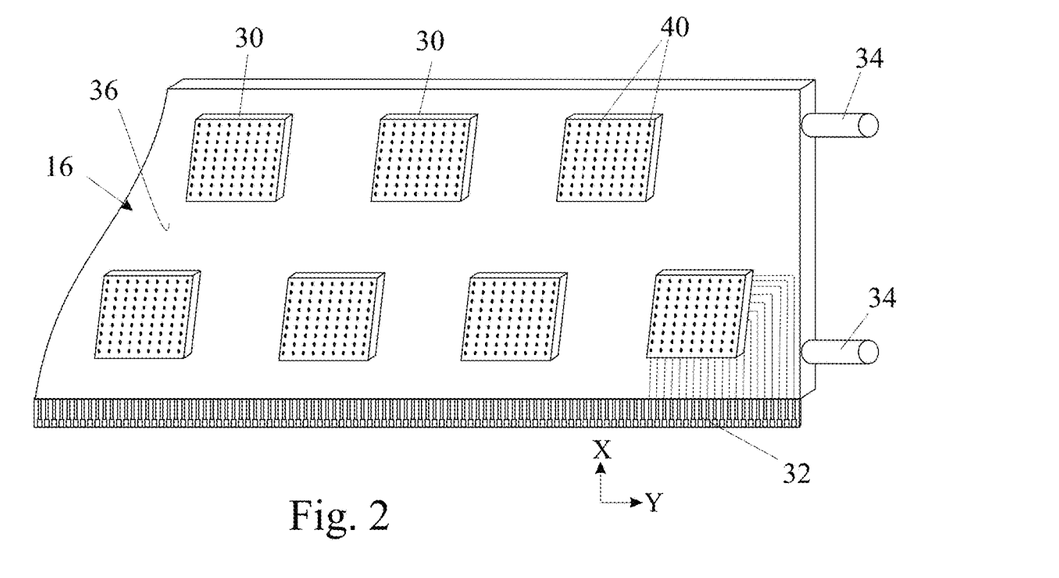
FIG. 2 shows part of an imaging device comprising a set of VCSEL chips mounted on a support.
Figure 3:
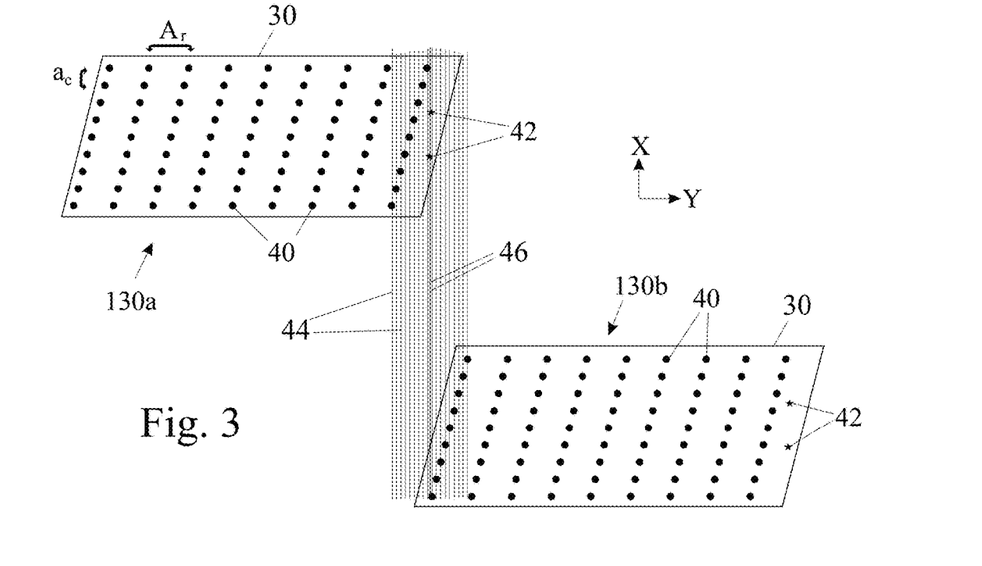
FIG. 3 is a schematic representation of the laser emitting elements of two VCSEL chips and the lines that they can trace on a relatively moving imaging surface.
Figure 4:
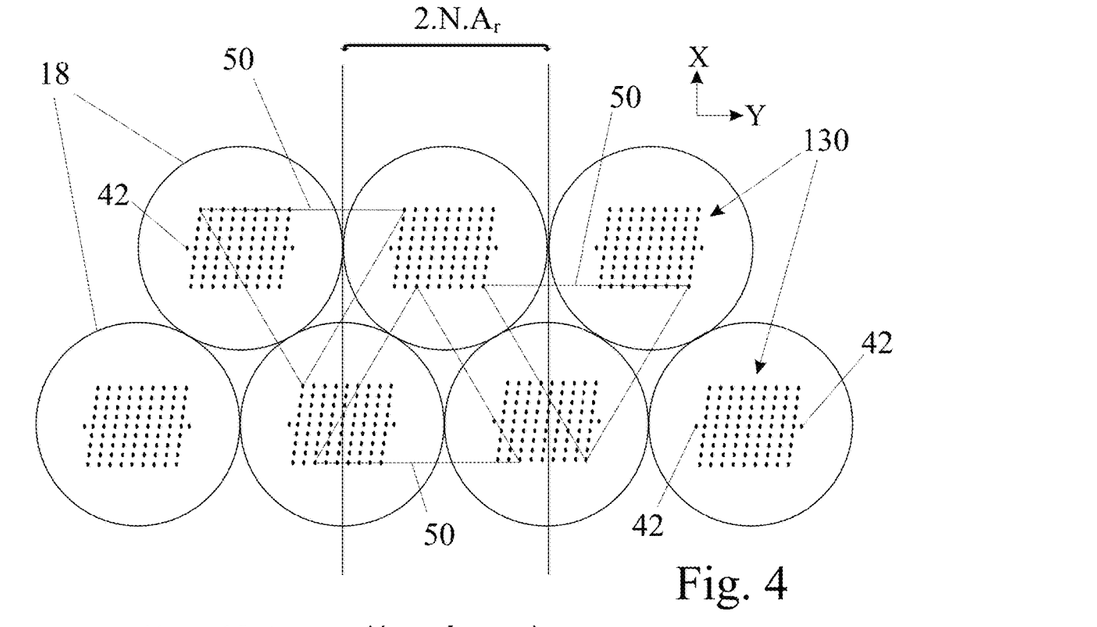
FIG. 4 is a schematic representation that demonstrates in one pair of rows the alignment between the VCSEL chips and the GRIN rods used as lenses to focus the emitted laser beams onto the imaging surface.

Preferably, the chips can be individually or collectively associated with an array of corresponding lenses 18 that focus the laser beams on the imaging surface 12 is also used. FIGS. 2 to 4 provide more details of the chips 30 according to some embodiments of the invention and on the manner in which they can be mounted on the support and aligned with the lenses 18.

FIG. 2 shows a support 16 on which are mounted a plurality of VCSEL chips 30 arranged in two rows in accurately predetermined positions relative to one another, as will be described in more detail by reference to FIGS. 3 and 4.

The support 16 is a rigid and in some embodiments at least partially hollow elongate body fitted with connectors 34 to allow a cooling fluid to flow through its internal cavity. In some embodiments, the body of the support may be made of an electrically insulating material, such as a suitable ceramic, or it may be made of a metal and at least its surface 36 on which the chips 30 are mounted may be coated with an electrical insulator. This enables a circuit board made of thin film conductors (partial and symbolic depiction of the conductors is schematically shown to the lower-right chip at FIG. 2) to be formed on the surface 36. The chips 30 are soldered to contact pads on this circuit board and a connector 32 projecting from the lower edge of the support 16 allows control and power signals to be applied to the chips 30. The laser emitting elements 40 of each chip 30 are individually addressable and are spaced apart sufficiently widely to minimize thermal interference with one another.

In some embodiments, the individually controllable laser elements of a chip can emit laser beams having variable energy that is preferably digitally controllable in discrete steps, allowing the laser intensity to be set at discrete levels such as 2, 4, 8, 16 . . . and the like, and in some embodiments individual laser beam sources may be controllably set to emit up to 4096 levels or more. The lowermost level of energy is defined as 0, where the individual laser element is not activated, the uppermost level of energy can be defined as 1. The distinct intermediate levels therebetween may be considered analogous in the field of printing to "grey levels", each level providing for a gradually distinct intensity (e.g., shade when considering a colored output). Taking for instance, a laser beam emitting element having 16 levels of activation, level 0 would result in lack of impression (e.g., leaving a substrate bare or white if originally so) and level 1 would result in transfer of a tacky film formed by a particle irradiated at maximum energy (e.g., forming a full black dot in the event the particles are so colored). In previous illustrative example, levels 1/16, 2/16, 3/16 and so on would correspond to increasingly stronger shades of grey, comprised between white (0) and black (1). Typically, the energy levels are evenly spaced.

In an alternative embodiment, the individually controllable laser elements of a chip can emit laser beams having variable energy that can be modulated in a continuous analogue manner.

Once a region of the imaging surface has reached a temperature at which the particles become tacky, any further increase in temperature will not have any effect on the transfer to the substrate. However, it should also be noted that as the intensity of the laser is increased the size of the dot that is rendered tacky also increases.

Figure 6:
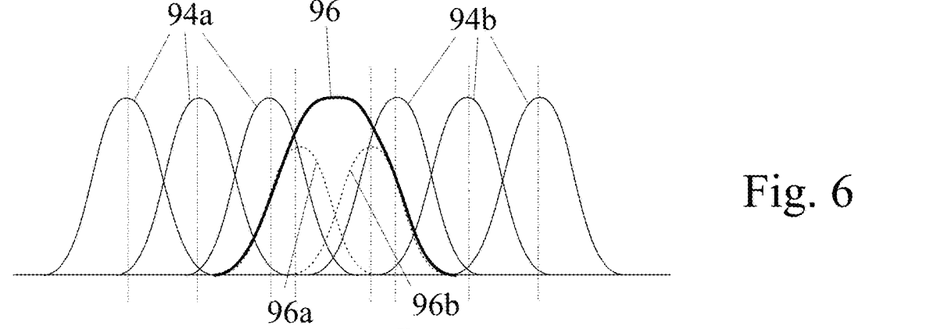
FIG. 6 shows the energy profiles produced by the laser elements at the ends of two adjacent arrays, to illustrate how a single line can be traced using two laterally positioned laser elements, there being shown for each array three elements of the main array and one of the additional elements.

The energy profile of each dot resembles the plots shown in FIG. 6, that is to say that it is symmetrical with tapering sides. The exact profile is not important as the distribution may be Gaussian, sinusoidal or even an inverted V. In any such profile, as the peak intensity increases, the base widens and the area of intersection of the profile with a threshold at which the particle coating is rendered tacky also increases in diameter. A consequence of this energy distribution is that points of the imaging surface that are not in alignment with the centerline of any one laser emitting element will receive energy from adjacent elements. It is possible for two nearby elements to be energized to below the level needed to render coating particles on the centerline of the elements tacky, yet for the cumulative energy in the region of overlap between the two centerlines to rise above the level necessary to render the coating particles tacky. In this way, it is possible to create potential raster lines between the centerlines of the laser lines in addition to, or as an alternative to, the raster lines coinciding with the centerlines of the laser elements. This ability to combine the energies from adjacent elements is used to achieve different effects, as will be described below. These effects are dependent upon the ability of the imaging surface to combine energies received from different laser elements, even if there is a slight difference between the times of irradiation.

FIG. 3 shows schematically, and to a much enlarged scale, the relative positioning of two laser emitting element arrays 130a and 130b of chips 30 that are adjacent one another in the Y-direction but are located in different rows. Each of the chips has a main array of M by N laser emitting elements 40, as previously described, which are represented by circular dots. In the example illustrated, M and N are equal, there being nine rows and nine columns. The spacing between the elements in a row, designated $A_r$, and the spacing between the elements in a column, designate $a_c$, are shown as being different from one another but they may be the same. The array is shown as being slightly skewed so that the columns and rows are not perpendicular to one another. Instead, the rows lie parallel to the Y-direction while the columns are at a slight angle to the X-direction. This enables lines, such as the lines 44, traced by the elements 40 on the imaging surface, if energized continuously, to be sufficiently close together to allow high resolution images to be printed. FIG. 3 shows that the element at the end of each row traces a line that is a distance $A_r/M$ away from the line traced by the corresponding element of each adjacent row, the separation between these lines being the image resolution $I_r$. Thus, assuming a magnification of |1|, $A_r$ and M are selected in dependence upon the desired image resolution, based on the equation $A_r = M \cdot I_r$.

It should be mentioned that it is possible for the elements to lie in a square array where the columns are perpendicular to the rows. In this case, the chips would need to be mounted askew on their support and compensation would need to be applied to the timing of the control signals used to energize the individual elements.

Figure 5A:
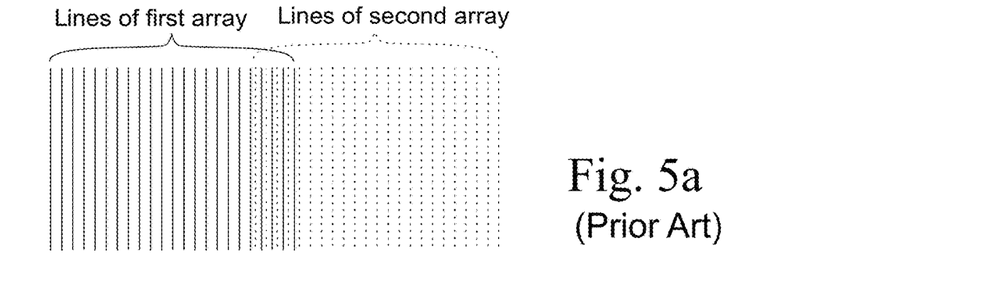
FIG. 5A shows prior art proposals for correction of chip misalignment.
Figure 5B:
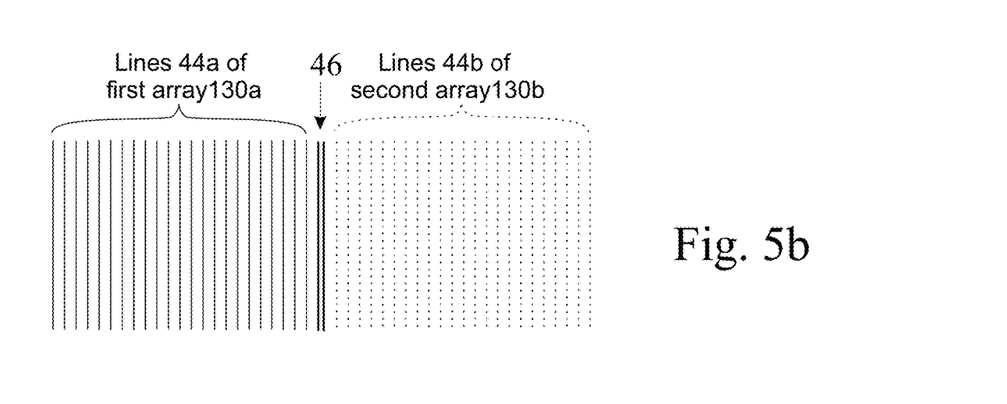
FIG. 5B shows the manner in which an embodiment of the invention compensates for chip misalignment.

As is clear from FIG. 3, and also FIG. 5B which shows the traced lines to a larger scale, the positioning of the array 130b is such that the line traced by its bottom left element 40 should ideally also be spaced from the line traced by the top right element of the array 130a by a distance equal to $A_r/M$. Therefore when all the elements 40 of both arrays 130a and 130b are energized, they will trace 2·M·N lines that will all be evenly spaced apart by a distance $A_r/M$ between adjacent lines, without any gaps.

If one wishes to provide compensation for defective elements, the array could include additional rows of laser emitting elements 40, but it is alternatively possible to compensate for a defective element by increasing the intensity of the laser beams generated by the laser emitting elements that trace the two adjacent parallel lines.

In addition to the M by N array of elements 40, each chip has at least one additional column that is arranged along the Y-direction on the side of the main array, the additional column containing at least one laser beam emitting element 42. These further elements 42 are represented in FIG. 3 by stars, to distinguish them from the main array elements 40. As seen in FIG. 4, in some embodiments at least two such additional columns each of one element 42 are provided, at least one column disposed in Y direction on each side of the main N by M array. The additional laser elements of the additional columns on one or both sides of each main array can be respectively positioned at a distance of ½ or ⅓ the spacing between traced lines that can be imaged by the lenses onto the imaging surface. Furthermore additional elements could be placed in the gap between two arrays that nominally spans a distance of $A_r/M$ so that higher sensitivity is achieved in correcting the spacing errors between adjacent arrays.

Any additional element 42 of an additional column can be positioned in the column at any desired distance from the edge element of the main array, the distance in the Y-direction depending on the total numbers of additional elements/additional columns each two sets of main arrays of a pair of chips to be aligned would bound. Assuming n additional elements 42 between a first and second main array, n being a positive integer number, each additional element can be spaced from the edge element of the main arrays or from one another in the Y-direction by a distance equal to $A_r/(n+1)$, namely the spacing of the adjacent elements in each row divided by one more than the number of additional elements in the gap. Considering now the X-direction, the additional elements can either be aligned with a row of elements of their respective main arrays or positioned at any desired intermediate position above or below such rows. Preferably the positioning of an additional element 42 with respect to adjacent elements of the main array shall minimize thermal interference. Notably, the additional element or elements may be disposed at any position along the X-direction of the chip.

In practice n elements 42 positioned in any of the additional columns on one or both sides of the main array, can correct for alignment errors of up to about a 1/(n+1) of the nominal spacing between the edge elements of two adjacent chips. If, by way of example, the edge elements of the two chips are at a distance of 20 μm (micrometers) in the Y-direction, and there is a single additional laser emitting element on adjacent sides of each array, such elements may correct a spacing error of up to about one third of the nominal spacing, in the exemplified case approximately 7 μm. Any positional deviation from the desired position on the chip (e.g., with respect to its edges) or nominal distance between elements not exceeding 10%, is considered within tolerances, however in most cases due to the high precision of the semiconductor manufacturing methods, such errors are unlikely.

As can be seen from FIG. 3 and FIG. 5B, when activated, these elements 42 trace two additional lines 46 between the two sets of evenly spaces parallel lines 44a and 44b traced by the elements 40 of the two arrays 130a and 130b, respectively.

One of the additional lines 46 is spaced by a distance $A_y/3M$ from the last adjacent line 44a traced, for example, by the array 130a in FIG. 3 and the other is spaced by a distance $A_y/3M$ from the first adjacent line 44b traced, for example, by the array 130b. In the event of a misalignment between the two arrays 130a and 130b these elements 42 can be energized in addition to, or instead of some of, the elements 40 of the main arrays to compensate for any misalignment between the arrays 130a and 130b that tends to create a stripe in the printed image, be it a gap or a dark line resulting from an unintentional overlap. FIG. 5A, which is similar to FIG. 5B, shows the alternative approach proposed in the prior art to compensate for chip misalignment. In the prior art, each chip has an additional row of elements that produces traced lines that are interlaced with the traced lines of the adjacent chip, resulting in a very high degree of redundancy.

While the two additional elements 42 in the present embodiment are shown in FIG. 3 and FIG. 5B as tracing two separate lines 46, the energies of these two elements can be combined on the imaging surface, as earlier described, to form a single line of which the position is controllable by appropriate setting of the energies emitted by each of the additional elements 42. This is shown in FIG. 6 in which the energy profiles of the lines 44a and 44b are designated 94a and 94b, respectively and the energy profiles of the additional lines 46 are designated 96a and 96b. In FIG. 6, neither of the profiles 96a and 96b (shown in dotted lines) has sufficient energy to render the coating particles tacky but at the centerline between the two arrays the cumulative energy, shown as a solid dark line 96, is sufficient to soften the particles coating and to create a trace line filling the gap between the trace lines 44a and 44b of the two main arrays.

While in FIG. 6 the energy profiles of the two additional elements are matched, it is possible by varying the relative intensity of the two beams emitted by the additional laser sources to position the centerline of the combined energy at a different distance from the traces of the main arrays.

Figure 7A:
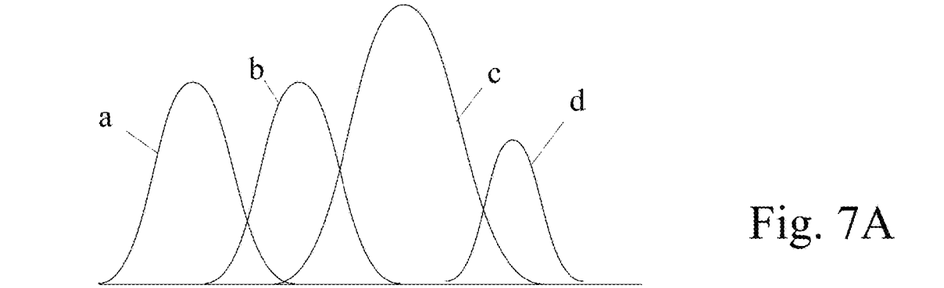
FIG. 7A is a similar energy diagram to FIG. 6 to show how the energies of two adjacent laser elements of the main array can be combined on the imaging surface to produce an additional dot that does not fall on the center line of either of the laser elements.
Figure 7B:
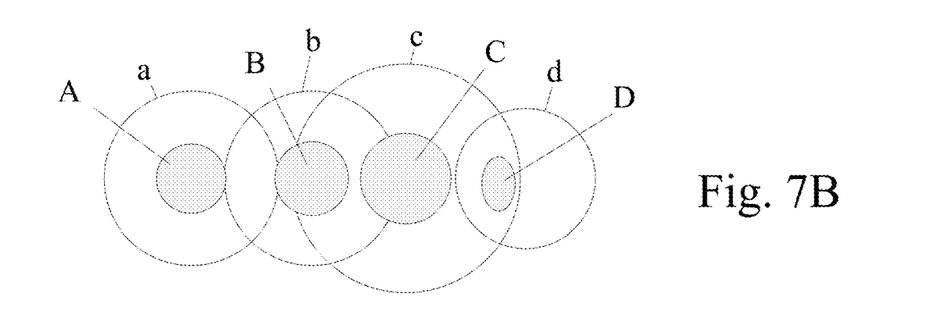
FIG. 7B shows the dot pattern on the imaging surface produced by activating four laser elements of the main array in the manner shown in FIG. 7A.

FIG. 7A shows how the ability to create dots that do not fall on the centerlines of the energy profiles of the laser elements can be used to advantage to achieve anti-aliasing. FIG. 7A shows the energy profiles of four adjacent elements of the main array. The first two profiles a and b are set at a desired level, say 8 (out of sixteen), corresponding to mid-grey. The energy profiles c and d, on the other hand are set to say 12 and 4, respectively. The resulting dot pattern produced on the imaging surface is shown in FIG. 7B. This can be seen to comprise two regular sized dots A and B aligned with the line of symmetry of the profiles a and b in FIG. 7A, a larger sized dot C aligned with the centerline of energy profile c, and a smaller dot D that lies somewhere between the centerlines of the profiles c and d.

Figure 8A:
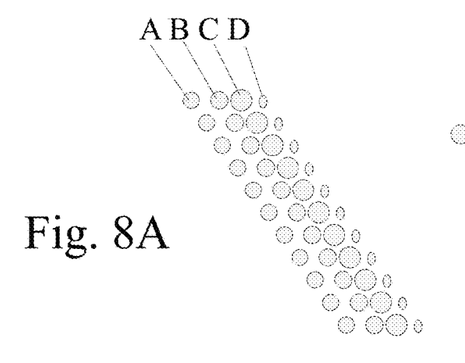
FIG. 8A shows how the dot pattern of FIG. 7B assists in anti-aliasing.
Figure 8B:
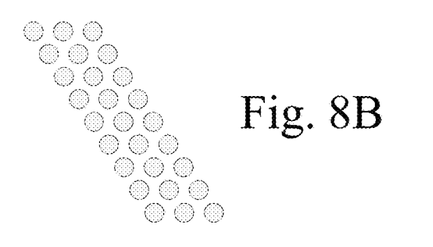
FIG. 8B shows for comparison with FIG. 8A the jagged edge that normally occurs when printing an oblique line.

The result of repeating such a dot pattern diagonally is shown in FIG. 8A. When this image is compared with FIG. 8B, where no anti-aliasing steps have been taken, it will be seen that the small dots in between regular raster line yield oblique edges that have reduced jaggedness and produce an image that is comparable with one achievable by a printing system having a greater image resolution.

The interaction of energies from nearby laser elements can also be used to compensate for missing or inoperative elements in that the elements producing the two adjacent raster lines can be used to combined in the same manner as previously explained to fill in a gap between them.

For the arrays 130a and 130b in FIG. 3 to function correctly as described above, their relative position in the Y-direction is very important. In order to simplify the construction of the lens system serving to focus the emitted laser beams on the imaging surface it is advantageous to adopt a configuration shown in FIG. 4 which enables the two rows of lenses corresponding to a pair of chip rows to be self-aligning.

FIG. 4 shows arrays of seven adjacent chips 130 each shown lined up with a respective lens 18. Additional laser elements 42, on each side of the main array of each chip, are also schematically illustrated in the figure. Each lens 18 is constructed as a GRIN (Gradient-Index) rod, this being a known type of lens that is shaped as a cylinder having a radially graduated refractive index. In the case of the geometry shown in FIG. 4, the respective centers of corresponding elements of any three bi-directionally adjacent chip arrays 130 lie nominally on the apices of an equilateral triangle, three such triangles designated 50 being shown in the drawing. It will be noted that all the triangles 50 are congruent. As a result, if the diameter of the GRIN rods is now selected to be equal to $2 \cdot N \cdot A_y$, which is the length of the sides of the equilateral triangles 50, or the distance between corresponding laser emitting elements of adjacent VCSEL chips 30 in the same row, then when stacked in their most compact configurations, after aligning the lens array to the Y-direction over the chips, the lenses 18 will automatically align correctly with their respective chip. For such construction, the relationship between the rod lens diameter D, the image resolution $I_r$ and the size of the matrix of laser elements is: $D = 2 I_r \cdot M \cdot N$ where $I_r$ is the spacing in the Y-direction between adjacent lines traceable in the X-direction and M is the number of rows and N the number of columns in the main M·N array, assuming absolute magnification value of |1|.

Figure 9:
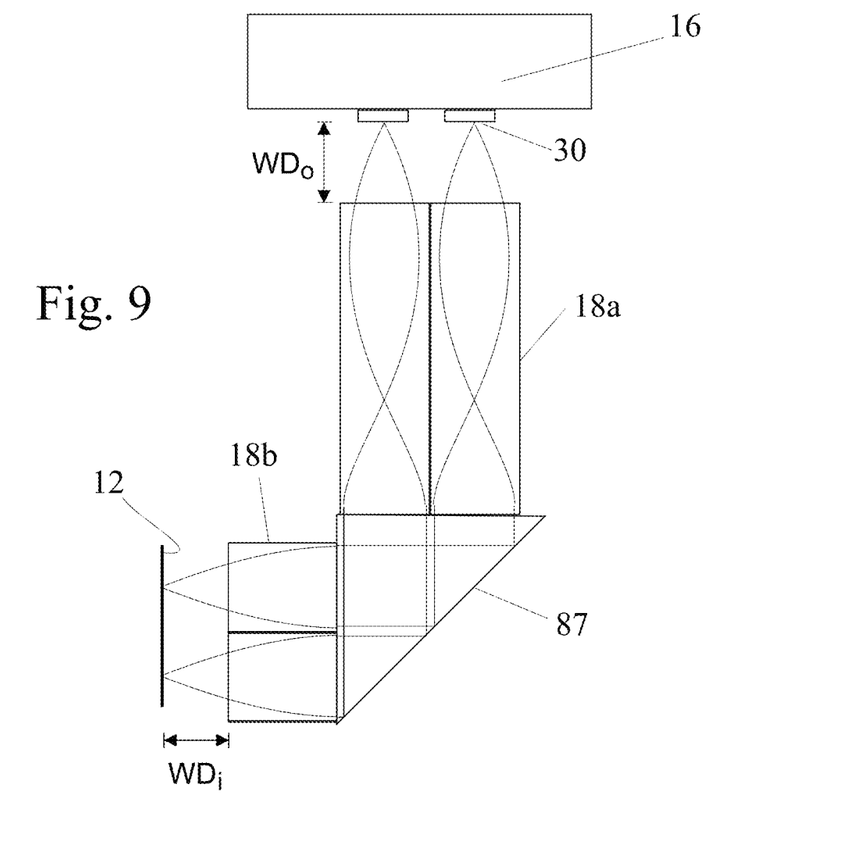
FIG. 9 shows an alternative lens system to that shown in FIG. 1 that has a folded light path to permit more compact packaging in a printing system.

Though the lens 18 has been schematically illustrated in FIG. 1 (side view) and FIG. 4 (cross section view) as being an individual GRIN rod, in alternative embodiments the laser beams of each chip can be transmitted by a series of lenses. In the simplified embodiment shown in FIG. 9, the single GRIN rod 18 is replaced by two mutually inclined GRIN rods 18a and 18b and the light from one is directed to the other by a reflecting member which in the example of FIG. 9 is embodied by a prism 87 of high refractive index glass, so that the light follows a folded path. It is noted that other reflecting members such as mirrors and the like may be utilized. Such a configuration enables coating stations in a colour printing system to be arranged closer to one another in a more compact configuration. Such a folded light path can adopt different configurations while fulfilling all the requirements of magnification and light transmission. To enable the light path to be split in this manner, the length of the GRIN rods is preferably selected such that light beams are individually collimated on leaving the rods 18a and entering the rods 18b as shown by the light rays drawn in FIG. 9.

The radiation guided by GRIN rod 18a, the proximal end of which is arranged at a distance $WD_o$ from the chip, may be captured by the corresponding GRIN rod 18b which can collect the collimated light emerging from rod 18a on the same light path and focus it at a distance $WD_i$ from the distal end of the second GRIN rod 18b. When the two GRIN rods are made of the same material and the same radial gradient profile and $WD_o=WD_i$ a magnification of $M_o=+1$ or $-1$ can be obtained.

Notably, with straight or folded path light paths, the magnification should be considered substantially equal to its nominal value if within ±0.5% or even 1% or 2%.

Laser elements that are away from the longitudinal axis of the GRIN rod 18a will leave the distal end of the GRIN lens collimated but at an angle to the axis. In certain cases, it is necessary for the distance between the two rods 18a and 18b to be large, causing the off axis collimated beams exiting the first rod segment to miss partially or entirely the second segment. It is possible to take advantage of Snell's law and cause the beam exiting the first rod to travel through a glass with a high refractive index, thus causing the angle the collimated beam makes with the optical axis to decrease and enabling a larger separation between the rods before the collimated beams leaving the first rod miss the entrance to the second rod.

In the description and claims of the present disclosure, each of the verbs, "comprise" "include" and "have", and conjugates thereof, are used to indicate that the object or objects of the verb are not necessarily a complete listing of members, components, elements, steps or parts of the subject or subjects of the verb.

As used herein, the singular form "a", "an" and "the" include plural references and mean "at least one" or "one or more" unless the context clearly dictates otherwise.

Positional or motional terms such as "upper", "lower", "right", "left", "bottom", "below", "lowered", "low", "top", "above", "elevated", "high", "vertical", "horizontal", "backward", "forward", "upstream" and "downstream", as well as grammatical variations thereof, may be used herein for exemplary purposes only, to illustrate the relative positioning, placement or displacement of certain components, to indicate a first and a second component in present illustrations or to do both. Such terms do not necessarily indicate that, for example, a "bottom" component is below a "top" component, as such directions, components or both may be flipped, rotated, moved in space, placed in a diagonal orientation or position, placed horizontally or vertically, or similarly modified.

Unless otherwise stated, the use of the expression "and/or" between the last two members of a list of options for selection indicates that a selection of one or more of the listed options is appropriate and may be made.

The imaging device is described herein mainly by reference to its application in digital printing systems however its use is not limited to this application, and different aspects of the invention may be implemented to project light beams onto any surface with relative motion between the surface and the chips.

In the disclosure, unless otherwise stated, adjectives such as "substantially" and "about" that modify a condition or relationship characteristic of a feature or features of an embodiment of the present technology, are to be understood to mean that the condition or characteristic is defined to within tolerances that are acceptable for operation of the embodiment for an application for which it is intended. For instance, each two adjacent elements of the group of elements under consideration (such as by way of example of a chip row, of a chip column, or of adjacent chip arrays, when applicable) are considered "substantially uniformly spaced" if the deviation of each pair of adjacent elements from a desired nominal distance does not exceed 10% of this predetermined spacing. Pairs of adjacent elements deviating from the nominal distance by less than 5%, 4%, 3%, 2% or 1% are further considered "substantially uniformly spaced" or "having a substantially uniform spacing". By way of example, assuming a desired $A_r=20$ micrometers, and the desired nominal spacing in the Y-direction between corresponding main array laser emitting elements in two adjacent chips equals $A_r \cdot N$, spacing deviations resulting from manufacturing tolerance of no more than 2 μm, are considered to fall within the nominal spacing. Clearly, smaller or no deviations are desired.

While this disclosure has been described in terms of certain embodiments and generally associated methods, alterations and permutations of the embodiments and methods will be apparent to those skilled in the art. The present disclosure is to be understood as not limited by the specific embodiments described herein.

The invention claimed is:

1. A method of projecting individually controllable laser beams onto an imaging surface that is movable relative to an imaging device, the method comprising:

providing an imaging device for projecting individually controllable laser beams onto an imaging surface, the imaging device and imaging surface being movable relative to each other in a reference X-direction, the imaging device comprising:

a plurality of semiconductor chips each of which comprises a plurality of individually controllable laser beam emitting elements arranged in a two dimensional main array of M rows and N columns, the emitting elements in each row having a uniform spacing $A_r$, and the emitting elements in each column having a uniform spacing $a_c$;

the chips are mounted on a support such that the main arrays of each pair of chips that are adjacent one another in a reference Y-direction, transverse to the X-direction, are offset from one another in the X-direction;

wherein were all the emitting elements to be activated continuously and were the chips and the imaging surface to be relatively moved in the X-direction, the emitted laser beams of the two chips of the pair would trace on the imaging surface 2·M·N parallel lines that extend in the X-direction and are uniformly spaced from one another in the Y-direction, by a nominal distance $A_r/M$, whereby the laser beams of each chip trace a set of M·N lines without overlapping the set of lines of the other chip;

each chip further comprises at least one additional column in addition to the N columns of elements of the main array, the additional column being disposed on one side of the main array along the Y-direction, and containing at least one selectively operable laser emitting element capable of tracing at least one additional line that lies between the respective sets of M·N lines of each chip and that is spaced from two adjacent lines, each from a respective one of the sets, by a distance smaller than the uniform element spacing in each row $A_r$; and, individually projecting the laser beams onto the imaging surface.

2. A method as claimed in claim 1, further comprising the step of controllably projecting a laser beam emanating from the at least one emitting element of the at least one additional column of a first of two adjacent chips, the laser beam impinging on the imaging surface between laser beams impinging on the imaging surface from at least two laser beams emanating from emitting elements at the edge of the respective main arrays of the first and a second of two adjacent chips.

3. A method as claimed in claim 2, wherein the additional column of the first chip of the pair of chips and the additional column of the second chip are disposed between the respective main arrays of the first and second chip, the method further comprising the step of controllably projecting a first laser beam emanating from one emitting element of the additional column of the first chip and a second laser beam emanating from the additional column of the second chip, such that the first and second laser beams impinge on the imaging surface at sufficient proximity to cause the energy of the respective laser beams to act additively thereupon.

4. A method as claimed in claim 3, further comprising the step of controlling the energy of each of the first and second laser beams such that each of the beams act on the imaging surface at an energy level below a predetermined threshold, and the additively combined energy level of the two beams surpasses the predetermined threshold, the additively combined energy level impinges on the imaging surface at a location between the respective first and second beam centers.

5. A method as claimed in claim 1, further comprising the step of controllably projecting a first and second laser beams emanating respectively from two emitting elements adjacent in the Y direction, at controlled intensity such that the first and second laser beams impinge on the imaging surface at sufficient proximity and intensity to cause the energy of the respective beams to act additively thereupon.

6. A method as claimed in claim 5, further comprising the step of controlling the energy of first and second laser beams such that each of the beams act on the imaging surface at an energy level below a predetermined threshold, and the additively combined energy level of the first and second laser beams surpasses the predetermined threshold, the additively combined energy level impinges on the imaging surface at a location between the respective first and second beam centers.

7. A method as claimed in claim 1, wherein the at least one additional column comprises a plurality of emitting elements.

8. A method as claimed in claim 1, wherein the imaging device further comprises a plurality of lens systems, each serving to focus the laser beams of all the emitting elements of a respective chip onto the imaging surface.

9. A method as claimed in claim 8, wherein at least one of the plurality of lens systems comprises at least one gradient index (GRIN) rod.

10. A method as claimed in claim 9, wherein the at least one GRIN rod is of circular cross-section having a diameter equal to $2 \cdot N \cdot A_r$.

11. A method as claimed in claim 1, wherein each chip comprises at least a second additional column, such that at least one additional column is disposed on each side of the respective main array, the second additional column comprising at least one individually controllable laser beam emitting element.

12. A method as claimed in claim 1, wherein each chip has an equal number of rows and columns of emitting elements in the main array.

13. A method as claimed in claim 1, wherein the surface of the support is formed of, or coated with, an electrical insulator, and further comprising a plurality of thin film conductors formed on the electrically insulating surface for supplying electrical signals and power to the chips.

14. A method as claimed in claim 1, wherein the support is liquid cooled.

15. A method as claimed in claim 1, wherein the emitting elements of at least one chip are of vertical cavity surface emitting lasers (VCSEL) type.

* * * * *